(12) United States Patent
Niiyama

(10) Patent No.: US 8,373,957 B2
(45) Date of Patent: Feb. 12, 2013

(54) LOAD DRIVING CIRCUIT AND PROTECTION METHOD

(75) Inventor: Kenichi Niiyama, Kyoto (JP)

(73) Assignee: Rohm Co., Ltd. (JP)

( * ) Notice: Subject to any disclaimer, the term of this patent is extended or adjusted under 35 U.S.C. 154(b) by 1204 days.

(21) Appl. No.: 11/888,560

(22) Filed: Aug. 1, 2007

(65) Prior Publication Data

US 2008/0030174 A1   Feb. 7, 2008

(30) Foreign Application Priority Data

Aug. 1, 2006  (JP) .................................. 2006-209597

(51) Int. Cl.
*H02H 3/20* (2006.01)
(52) U.S. Cl. ........................................ 361/91.1; 361/92
(58) Field of Classification Search .................. 361/91.1, 361/92
See application file for complete search history.

(56) References Cited

U.S. PATENT DOCUMENTS

| | | | |
|---|---|---|---|
| 5,396,117 A | | 3/1995 | Housen et al. |
| 6,107,844 A | * | 8/2000 | Berg et al. ..................... 327/110 |
| 6,275,023 B1 | * | 8/2001 | Oosaki et al. ............ 324/756.06 |
| 6,472,910 B2 | | 10/2002 | Niimi |
| 6,788,128 B2 | | 9/2004 | Tsuchida |
| 7,138,778 B2 | * | 11/2006 | Fujino et al. .................. 318/433 |

FOREIGN PATENT DOCUMENTS

| | | |
|---|---|---|
| JP | 8-97640 | 4/1996 |
| JP | 2004-260776 A | 9/2004 |
| TW | 200423538 | 10/2006 |

OTHER PUBLICATIONS

Japanese Office Action for Patent Application No. 2006-209597, dispatched Sep. 6, 2011, with English translation.
Taiwanese Office Action for Taiwanese Patent Application No. 096128032, dated Aug. 30, 2011, with English translation.
Notice of Rejection for Taiwanese Patent Application 096128032, dated Jan. 19, 2012, with English translation.

* cited by examiner

*Primary Examiner* — Jared Fureman
*Assistant Examiner* — Nicholas Ieva
(74) *Attorney, Agent, or Firm* — Cantor Colburn LLP

(57) ABSTRACT

A load driving circuit includes a first transistor and a second transistor that are bipolar transistors connected in series between a first fixed voltage (Vdd) and a second fixed voltage (GND), and supplies a drive current, according to ON-OFF states of the two transistors, to a load connected to an output terminal that is a connection point of the two transistors. A current source controls a base current supplying the first transistor. A protection circuit compares output voltage of the output terminal with a predetermined threshold voltage, and additionally monitors ON and OFF states of the first transistor. In a state in which Vout<Vth, and the first transistor is ON, the protection circuit reduces the base current of the first transistor.

2 Claims, 2 Drawing Sheets

LOAD DRIVING CIRCUIT AND PROTECTION METHOD

BACKGROUND OF THE INVENTION

1. Field of the Invention

The present invention relates to a load driving circuit, and in particular, to protection technology therefor.

2. Description of the Related Art

A load driving circuit which supplies a drive current or a drive voltage to a load is used in many electronic circuits, such as motor drivers, switching power supplies, and output stages of operational amplifiers. The load driving circuit in general performs push-pull operations, that is, an operation of "pushing" a current to a load, or an operation of "pulling" a current from a load. The load driving circuit includes a high side transistor and a low side transistor connected in series between two fixed voltages, for example, a power supply voltage and a ground voltage, and a connection point of the two transistors is connected to the load, as an output terminal.

In such a load driving circuit if the output terminal is grounded or is connected to a power supply line, there is a risk of an overcurrent flowing in the transistors or the load that is to be driven. Consequently, a protection function, that is short-circuit protection or short-to-supply protection is provided. Related technology is described in Patent Document 1.

Patent Document 1: Japanese Patent Application, Laid-Open No. H8-097640

SUMMARY OF THE INVENTION

The present invention was made in light of these problems, and a general purpose thereof is to provide a load driving circuit having a protection function which preferably protects a circuit from a short-to-ground fault (hereafter referred to as "ground fault"), short-to-supply fault (hereafter referred to as "supply fault"), or the like.

According to an embodiment of the present invention, there is provided a load driving circuit, which includes a high side transistor and a low side transistor that are bipolar transistors connected in series between a first fixed voltage terminal and a second fixed voltage terminal, and which supplies a drive current, according to an ON-OFF state of the two transistors, to a load connected to an output terminal that is a connection point of the two transistors. This load driving circuit is provided with a current source which controls base currents supplying the high side transistor and the low side transistor, and a protection circuit which compares an output voltage of the output terminal with a predetermined threshold voltage and which, when a predetermined condition is satisfied, reduces a base current of at least one of the high side transistor or the low side transistor.

According to the embodiment, when the output voltage deviates from a predetermined range, by determining a circuit abnormality and reducing the base current of the high side transistor or the low side transistor, since an extent to which the high side transistor or the low side transistor is ON is diminished, or the high side transistor or the low side transistor is OFF, circuit protection is realized. In addition, "reducing the base current" here includes complete interruption.

When the output voltage goes below a predetermined lower limit threshold voltage, the protection circuit may reduce the base current of the high side transistor.

By comparing the output voltage with the lower limit threshold voltage, it is possible to detect a ground-fault condition, and where there is a ground fault, it is possible to protect the circuit by diminishing the extent to which the high side transistor is ON.

The protection circuit may additionally monitor ON and OFF states of the high side transistor, and, in a state in which the high side transistor is ON, when the output voltage goes below the lower limit threshold voltage, the protection circuit may reduce the base current of the high side transistor.

In a state in which the high side transistor is ON, since there is a risk that, when the output terminal shorts to ground, a large current will flow, by detecting ON and OFF states of the high side transistor, appropriate circuit protection can be realized.

When the output voltage exceeds a predetermined upper limit threshold voltage, the protection circuit may reduce the base current of the low side transistor.

By comparing the output voltage with the upper limit threshold voltage, it is possible to detect a supply-fault condition, and when there is a supply fault, it is possible to protect the circuit by diminishing the extent to which the low side transistor is ON.

The protection circuit may additionally monitor ON and OFF states of the low side transistor, and, in a state in which the low side transistor is ON, when the output voltage exceeds the upper limit threshold voltage, the protection circuit may reduce the base current of the low side transistor.

In a state in which the low side transistor is ON, since there is a risk that, when the output terminal has a supply fault, a large current will flow, by detecting ON and OFF states of the low side transistor, appropriate circuit protection can be realized.

Another embodiment of the present invention is also a load driving circuit. The load driving circuit is provided with a high side transistor and a low side transistor that are bipolar transistors connected in series between a first fixed voltage terminal and a second fixed voltage terminal, a drive reference current source which generates a drive reference current, a first transistor which supplies, to a base of a high side transistor, a collector current that flows as a result of the drive reference current being supplied to the base, a comparator which compares voltage of an output terminal that is a connection point of the high side transistor and the low side transistor, with a predetermined threshold voltage, to detect a circuit abnormality, and a correction current source which becomes active in response to an output signal of the comparator, generates a correction current when there is a circuit abnormality, and subtracts the correction current from the drive reference current that is supplied to the first transistor.

According to this embodiment, when a circuit abnormality is detected, a base current of the high side transistor is reduced, and the circuit can be protected.

According to an even further embodiment of the present invention, a protection method is provided for a load driving circuit, which includes a high side transistor and a low side transistor that are bipolar transistors connected in series between a first fixed voltage terminal and a second fixed voltage terminal, and which supplies a drive current according to ON-OFF states of the two transistors, to a load connected to an output terminal that is a connection point of the two transistors.

This protection method includes a step of comparing an output voltage of the output terminal with a predetermined lower limit threshold voltage and when the output voltage goes below the lower limit threshold voltage, generating an abnormality signal of a predetermined level, and a step, when the abnormality signal is generated, of reducing the base current of the high side transistor.

A step of detecting ON and OFF states of the high side transistor may additionally be provided. When the high side transistor is ON, and an abnormality signal of a predetermined level is generated, the base current of the high side transistor may be reduced.

An even further embodiment of the present invention relates to a protection method for a load driving circuit, which includes a high side transistor and a low side transistor that are bipolar transistors connected in series between a first fixed voltage terminal and a second fixed voltage terminal, and which supplies a drive current, according to ON-OFF states of the two transistors, to a load connected to an output terminal that is a connection point of the two transistors. This protection method includes a step of comparing an output voltage of the output terminal with a predetermined upper limit threshold voltage and when the output voltage exceeds the upper limit threshold voltage, generating an abnormality signal of a predetermined level, and a step, when the abnormality signal is generated, of reducing the base current of the low side transistor.

A step of detecting ON and OFF states of the low side transistor may additionally be provided. When the low side transistor is ON, and an abnormality signal of a predetermined level is generated, the base current of the low side transistor may be reduced.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
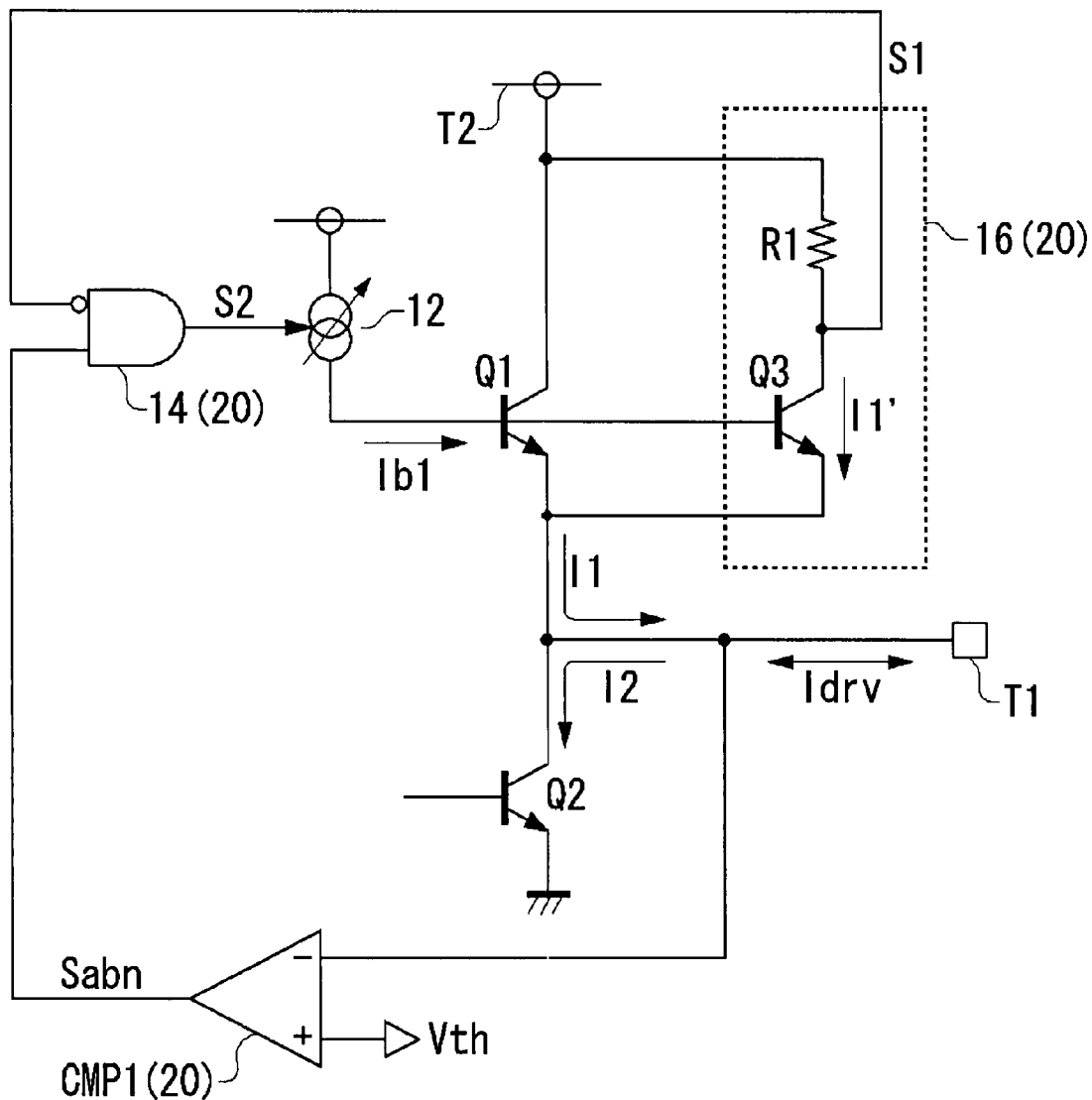
FIG. 1 is a circuit diagram showing a configuration of a load driving circuit according to an embodiment.

FIG. 1 is a circuit diagram showing a configuration of a load driving circuit 10 according to an embodiment. The circuit diagram of FIG. 1 functionally illustrates the configuration of the load driving circuit 10, and firstly, an overview of the load driving circuit 10 is explained using FIG. 1. The load driving circuit 10 of FIG. 1 is provided with a first transistor Q1, a second transistor Q2, an operation detection circuit 16, an abnormality detection comparator CMP1, a current source 12, and a logic gate 14.

A load, not shown in the figure, is connected to an output terminal T1. The first transistor Q1 and the second transistor Q2 are both NPN bipolar transistors, and are connected in series between a power supply terminal T2 to which a power supply voltage Vcc, which is a first fixed voltage, is supplied, and a ground terminal GND to which a ground voltage 0V, which is a second fixed voltage, is supplied. The first transistor Q1 is a high side transistor, the second transistor Q2 is a low side transistor, and a connection point of the two transistors is the output terminal T1. When the first transistor Q1 is ON, a source current I1 is supplied to a load via the output terminal T1, and when the second transistor Q2 is ON, a sink current I2 is pulled from the load via the output terminal T1. The load driving circuit 10 supplies a drive current Idrv to the load, in accordance with ON and OFF states of the first transistor Q1 and the second transistor Q2. The drive current Idrv is given by a difference between the source current I1 and the sink current I2.

The current source 12 supplies a base current Ib1 to the first transistor Q1, which is the high side transistor. The value of the base current Ib1 is adjusted to drive the load in a desired state. In the same way, a current source, not shown in the figure, is connected to a base of the second transistor Q2 also.

In FIG. 1, an abnormality detection comparator CMP1, a logic gate 14, and an operation detection circuit 16 form a protection circuit 20. The protection circuit 20 realizes a ground fault protection function. The protection circuit 20 compares output voltage Vout of the output terminal T1 with a predetermined threshold voltage Vth, and when a predetermined condition is satisfied, reduces the base current of the first transistor Q1, which is the high side transistor. In the present embodiment, the predetermined condition is Vout<Vth. The threshold voltage Vth is a voltage close to the ground voltage 0V, and is set outside a voltage range that the output voltage Vout can have when the circuit is operating normally.

The abnormality detection comparator CMP1 compares the output voltage Vout and the threshold voltage Vth, and when Vout<Vth, outputs an abnormality detection signal Sabn that has a high level. The abnormality detection signal Sabn is inputted to the current source 12, via the logic gate 14. Moreover, in the present specification, high level and low level refer to relative voltage values of a certain signal.

The protection circuit 20 is provided with a function for additionally monitoring ON and OFF states of the first transistor Q1, which is the high side transistor. When the first transistor Q1 is in an ON state, and the output voltage Vout goes below a lower limit threshold voltage Vth, the protection circuit 20 decreases the base current Ib1 of the first transistor Q1 generated by the current source 12.

The monitoring function of the first transistor Q1 is realized by an operation detection circuit 16. The operation detection circuit 16 includes a third transistor Q3 and a first resistor R1. The third transistor Q3, similar to the first transistor Q1, is an NPN bipolar transistor, and the first transistor Q1, base and emitter are commonly connected in a current mirror. The first resistor R1 is provided between a collector of the third transistor Q3 and the power supply terminal T2. A current I1' proportional to the first transistor Q1 flows in the third transistor Q3, and a voltage drop proportional to the current I1' occurs across the first resistor R1. That is, when the first transistor Q1 is in an ON state, since a voltage drop of a certain extent occurs across the first resistor R1, a voltage S1 at a connection point of the first resistor R1 and the third transistor Q3 has a low level, and when the first transistor Q1 is in an OFF state, the voltage S1 has a high level. Below, the voltage S1 at a connection point of the first resistor R1 and the third transistor Q3 is also referred to as an operation detection signal. The operation detection signal S1 is inputted to the current source 12, via the logic gate 14.

The logic gate 14 is an AND gate, and when the abnormal detection signal Sabn has a high level and the operation detection signal S1 has a low level, outputs a control signal S2 that has a high level, and at other times has a low level. When the control signal S2 has a high level, the current source 12 reduces the base current Ib1 supplied to the first transistor Q1.

An explanation will be given of operations of the load driving circuit 10 configured as above.

While the load driving circuit 10 is performing operations normally, since the abnormality detection signal Sabn has a low level, the control signal S2 outputted from the logic gate 14 always has a low level, and the current source 12 supplies, to the first transistor Q1, the base current Ib1 for driving the load in a desired state.

When the output terminal T1 of the load driving circuit 10 has a ground fault, and Vout<Vth, the abnormal detection signal Sabn goes to a high level. In this state, if the first transistor Q1 is OFF, since the operation detection signal S1 has a high level, the control signal S2 has a low level, and the current source 12 supplies, to the first transistor Q1, the base current Ib1, the same as for normal operation. In a state in which the first transistor Q1 is OFF, the base current Ib1 is primarily low or is 0.

In a state in which the output terminal T1 has a ground fault, when the first transistor Q1 is turned ON, since the operation detection signal S1 goes to a low level, and the control signal S2 goes to a high level, the current source 12 reduces the base current Ib1, and diminishes an extent to which the first transistor Q1 is ON, or completely turns it OFF.

According to the load driving circuit 10 of FIG. 1, as described above, by the ground fault being detected by the protection circuit 20, and the base current Ib1 of the first transistor Q1 being reduced when there is a ground fault, it is possible to realize circuit protection.

In addition, the protection circuit 20 is provided with the operation detection circuit 16; the protection circuit 20 detects ON and OFF states of the first transistor Q1 and, only in a state in which the first transistor Q1 is ON, reduces the base current Ib1 of the first transistor Q1. In a state in which the first transistor Q1 is ON, since there is a risk that if the output terminal T1 has a ground fault, a large current will flow, according to the load driving circuit 10 of FIG. 1, by detecting an OFF state, appropriate circuit protection can be realized.

In the load driving circuit 10 of FIG. 1, setting of high level and low level logical values of each signal is one example, and a person skilled in the art will easily understand that a similar function can be realized even if the example is reversed when appropriate.

Figure 2:
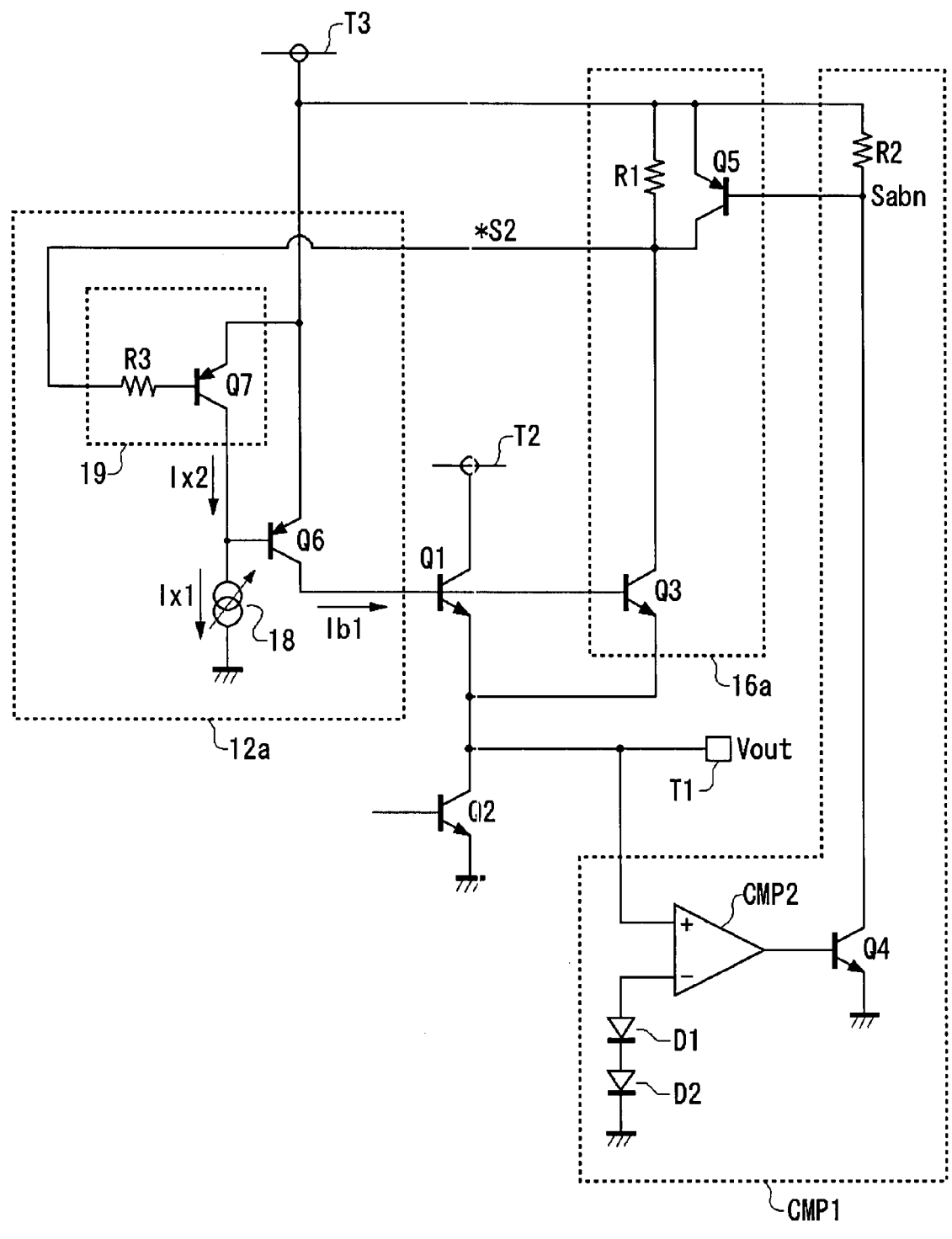
FIG. 2 is a circuit diagram showing a configuration of the load driving circuit according to the embodiment.

Next, an explanation will be given of a configuration of the load driving circuit 10 according to the embodiment, making reference to a more specific circuit diagram. FIG. 2 is a circuit diagram showing a configuration example of a load driving circuit 10a according to the embodiment. The load driving circuit 10a of FIG. 2 is provided with a protection function for a ground fault, similarly to the load driving circuit 10 of FIG. 1.

The load driving circuit 10a is provided with a first transistor Q1, a second transistor Q2, a current source 12a, an operation detection circuit 16a, and an abnormality detection comparator CMP1.

The abnormality detection comparator CMP1 of FIG. 2 corresponds to the abnormality detection comparator CMP1 of FIG. 1, and includes a comparator CMP2, a first diode D1, a second diode D2, a fourth transistor Q4, and a second resistor R2. A noninverting input terminal of the comparator CMP2 is connected to the output terminal T1, and an output voltage Vout is applied. The first diode D1 and the second diode D2 are connected in series, and generate a threshold voltage given by Vth=Vf×2. Vf is a diode forward direction voltage. Instead of the first diode D1 and the second diode D2, a constant voltage generated by a bandgap reference circuit may be used as the threshold voltage Vth. The threshold voltage Vth is applied to an inverting input terminal of the comparator CMP2.

The fourth transistor Q4 is an NPN bipolar transistor, an emitter thereof is grounded, and output of the comparator CMP2 is connected to a base. The second resistor R2 is arranged between a collector of the fourth transistor Q4 and a power supply terminal T3. Moreover, the power supply terminal T3 may be shared with the power supply terminal T2, or another power supply voltage may be supplied. The fourth transistor Q4 and the second resistor R2 function as an inverter, and invert an output signal of the comparator CMP2. Voltage of a connection point of the second resistor R2 and the fourth transistor Q4 is outputted to the logic gate 14 as an abnormality detection signal Sabn. The abnormality detection signal Sabn of FIG. 2, similarly to the abnormality detection signal Sabn of FIG. 1, has a low level in normal operation, that is, when Vout>Vth, and has a high level when there is an abnormality, that is, when Vout<Vth.

In FIG. 2, the operation detection circuit 16a has a function of the logic gate 14 and the operation detection circuit 16 of FIG. 1. The operation detection circuit 16a includes a third transistor Q3, a first resistor R1, and a fifth transistor Q5. A connection pattern of the third transistor Q3 and the first resistor R1 is similar to FIG. 1. The fifth transistor Q5 is a PNP bipolar transistor, the abnormality detection signal Sabn is applied to a base thereof, an emitter thereof is connected to the power supply terminal T3, and the fifth transistor Q5 is arranged in parallel to the first resistor R1.

Since in normal operation the abnormality detection signal Sabn has a low level, the fifth transistor Q5 is in an ON state. When the fifth transistor Q5 is ON, since the first resistor R1 is bypassed and only a very small current flows in the resistor R1, voltage drop does not occur, and as a result, the control signal S2 has a high level.

When there is an abnormality, since the abnormality detection signal Sabn has a high level, the fifth transistor Q5 is in an OFF state. At this time, when the first transistor Q1 is ON, a current proportional to the first transistor Q1 flows in the third transistor Q3. At this time, since the fifth transistor Q5 is OFF, the current flowing in the third transistor Q3 is supplied via the first resistor R1. As a result, a voltage drop occurs across the first resistor R1, and the control signal *S2 has a low level.

When there is an abnormality, if the first transistor Q1 is in an OFF state, since a current does not flow in the third transistor Q3, a voltage drop) does not occur across the first resistor R1, and the control signal *S2 has a high level.

Accordingly, the control signal *S2 outputted from the operation detection circuit 16a is an inverse logic signal of the control signal S2 of FIG. 1, and the operation detection circuit 16a of FIG. 2 clearly has a function equivalent to the logic gate 14 and the operation detection circuit 16 of FIG. 1.

The control signal *S2 outputted from the operation detection circuit 16a is inputted to the current source 12a. The current source 12a includes a drive reference current source 18, a correction current source 19, and a sixth transistor Q6.

The sixth transistor Q6 is a PNP bipolar transistor, and is connected to the first transistor Q1 in a Darlington configuration. That is, an emitter of the sixth transistor Q6 is connected to the power supply terminal T3, and a collector thereof is connected to a base of the first transistor Q1. The drive reference current source 18 generates a drive reference current Ix1 for driving the load in a desired state. The drive reference current Ix1 generated by the drive reference current source 18 is a base current of the sixth transistor Q6, and the sixth transistor Q6 supplies, to the base of the first transistor Q1, a collector current flowing as a result of the drive reference current Ix1 that is supplied to the base.

The correction current source 19 becomes active in response to the control signal *S2, and has a function of generating a correction current Ix2 when there is a circuit abnormality, and subtracting the correction current Ix2 from the drive reference current Ix1 supplied as the base current to the first transistor Q1.

The correction current source 19 includes a seventh transistor Q7 and a third resistor R3. The seventh transistor Q7 is a PNP bipolar transistor; a collector thereof is connected to the base of the sixth transistor Q6, and an emitter thereof is connected to the emitter of the sixth transistor Q6. The control signal *S2 is inputted via the third resistor R3 to a base of the seventh transistor Q7.

When the control signal *S2 has a low level, the seventh transistor Q7 is in an ON state, and the correction current source 19 is active and generates the correction current Ix2. At this time, the base current or the sixth transistor Q6 becomes Ix1−Ix2, and decreases compared to when operations are normal.

Operations of the load driving circuit 10a of FIG. 2 configured as above will be explained. In normal operation in which the output terminal T1 does not have a ground fault, since the control signal *S2 has a high level, the correction current source 19 is inactive, and a base current, according to the drive reference current Ix1 generated by the drive reference current source 18, flows in the first transistor Q1.

With the first transistor Q1 now in an ON state, when the output terminal T1 has a ground fault, the control signal *S2 goes to a low level, and the correction current source 19 becomes active. As a result, the base current of the sixth transistor Q6 decreases, the base current Ib1 of the first transistor Q1 also decreases, the extent to which the first transistor Q1 is ON is diminished, and circuit protection is realized.

In this way, according to the load driving circuit 10a of FIG. 2, in a state in which the first transistor Q1, which is the high side transistor, is ON, when a ground fault occurs, the base current Ib1 of the first transistor Q1 can be reduced and it is possible to realizes the circuit protection.

An explanation has been given concerning the present invention above, based on the embodiment. This embodiment is an example; various modified examples of combinations of various component elements and various processes thereof are possible, and a person skilled in the art will understand that such modified examples are within the scope of the present invention. Below, an explanation is given concerning such a modified example.

In the circuit of FIG. 1 or of FIG. 2, the PNP type or NPN type of bipolar transistor may be switched as appropriate. Furthermore, for some of the transistors, a MOSFET (Metal Oxide Semiconductor Field Effect Transistor) may be used.

Moreover, in the circuits of FIG. 1 and FIG. 2, explanations were given concerning cases in which ground fault protection is carried out, but configurations in which short-to-supply protection is carried out are also applicable. In such cases, the operation detection circuit 16 is connected in parallel to the second transistor Q2, so as to detect ON and OFF states of the second transistor Q2. The abnormality detection comparator CMP1 compares the output voltage Vout with the upper limit threshold voltage Vth, and judges a state in which Vout>Vth, as a supply fault. Output of the logic gate 14 is inputted to a current source which controls a base current of the second transistor Q2, and when the output voltage Vout exceeds a predetermined upper limit threshold voltage Vth, the base current of the second transistor Q2 is reduced.

Furthermore, the operation detection circuit 16 performs voltage conversion on current flowing to a transistor arranged in parallel to the first transistor Q1, and detects ON and OFF states of the first transistor Q1, but there is no limitation thereto. For example, a configuration may be provided in which a resistor is arranged in series with the first transistor Q1, and ON and OFF states are detected based on a voltage drop across this resistor.

The load driving circuit of the present specification has a circuit configuration in which the high side transistor and the low side transistor are connected in series, and includes all arrangements that have a circuit form in which a connection point of two transistors is connected to a load. Accordingly, a push-pull output stage of an operational amplifier, a bridge circuit of a motor driver, an audio amplifier, and the like, are all included in the load driving circuit.

While the preferred embodiments of the present invention have been described using specific terms, such description is for illustrative purposes only, and it is to be understood that changes and variations may be made without departing from the spirit or scope of the appended claims.

What is claimed is:

1. A load driving circuit having a high side transistor and a low side transistor that are bipolar transistors connected in series between a first fixed voltage terminal and a second fixed voltage terminal, the load driving circuit supplying a drive current, according to an ON-OFF state of the two transistors, to a load connected to an output terminal that is a connection point of the two transistors, the load driving circuit comprising:

a current source which supplies base current to the high side transistor and which adjusts the values of the base currents of the high side transistor so that a desired driving current is supplied to the load; and a protection circuit configured to compares an output voltage of the output terminal with a predetermined threshold voltage, to monitor ON and OFF states of the high side transistor, and to reduce the base current of the high side transistor as to be lower than a value required to supply the desired driving current to the load when the output voltage goes below a predetermined lower limit threshold voltage while the high side transistor is on and wherein the protection circuit comprises:

a comparator configured to compare the output voltage of the output terminal with the predetermined lower limit threshold voltage;

a resistor provided on a path of a current that is proportional to a current flowing in the high side transistor;

a logic gate configured to receive an output signal of the comparator and a signal according to a voltage drop of the resistor, and to generate a control signal;

and wherein the base current of the high side transistor is reduced according to the control signal.

2. A load driving circuit having a high side transistor and a low side transistor that are bipolar transistors connected in series between a first fixed voltage terminal and a second fixed voltage terminal, the load driving circuit supplying a drive current, according to an ON-OFF state of the two transistors, to a load connected to an output terminal that is a connection point of the two transistors, the load driving circuit comprising:

a current source which supplies base current to the low side transistor and which adjusts the values of the base currents of the low side transistor so that a desired driving current is supplied to the load; and a protection circuit configured to compares an output voltage of the output terminal with a predetermined upper limit threshold voltage, to monitor ON and OFF states of the low side transistor, and to reduce the base current of the low side transistor so as to be lower than a value required to supply the desired driving current to the load when the output voltage exceeds a predetermined upper limit threshold voltage while the low side transistor is on, wherein the protection circuit comprises:

a comparator configured to compare the output voltage of the output terminal with the predetermined upper limit threshold voltage;

a resistor provided on a path of a current that is proportional to a current flowing in the low side transistor;

a logic gate configured to receive an output signal of the comparator and a signal according to a voltage drop of the resistor, and to generate a control signal;

and wherein the base current of the low side transistor is reduced according to the control signal.

* * * * *